United States Patent [19]

Friedrich

[11] Patent Number: 5,402,013

[45] Date of Patent: Mar. 28, 1995

[54] COMMON MODE LOGIC MULTIPLEXER CONFIGURATION

[75] Inventor: Dirk Friedrich, München, Germany

[73] Assignee: Siemens Aktiengesellschaft, Munich, Germany

[21] Appl. No.: 191,878

[22] Filed: Feb. 4, 1994

[30] Foreign Application Priority Data

Feb. 12, 1993 [DE] Germany .................. 43 04 262.7

[51] Int. Cl.$^6$ .......................................... H03K 19/086
[52] U.S. Cl. ...................................... 326/127; 326/21; 327/411
[58] Field of Search .................. 307/443, 455, 243

[56] References Cited

U.S. PATENT DOCUMENTS

| | | | |
|---|---|---|---|
| 4,806,785 | 2/1989 | Michail et al. | 307/443 |
| 4,902,916 | 2/1990 | Cecchi et al. | 307/455 |
| 5,172,015 | 12/1992 | Barre | 307/455 |
| 5,323,068 | 6/1994 | Freitas | 307/455 |

FOREIGN PATENT DOCUMENTS

| | | |
|---|---|---|
| 4030631 | 7/1992 | Germany . |
| 6220422 | 1/1987 | Japan . |
| 1160541 | 6/1985 | U.S.S.R. . |

*Primary Examiner*—Edward P. Westin
*Assistant Examiner*—Benjamin D. Driscoll
*Attorney, Agent, or Firm*—Herbert L. Lerner; Laurence A. Greenberg

[57] ABSTRACT

A multiplexer configuration includes at least one first and one second group of transistors each including one first, one second and at least one third transistor. Current sources are connected to a first supply potential terminal and emitters of the transistors of each respective one of the groups are connected to one another and to a respective one of the current sources. A first resistor has one terminal connected to a second supply potential terminal and has another terminal and collectors of the first transistors of each respective one of the groups are connected to one another and to the other terminal of the first resistor. An output terminal is connected to the other terminal of the first resistor. Bases of the second transistors of each respective one of the groups are input terminals for a respective data signal. Bases of the third transistors of each respective one of the groups are terminals for a respective selection signal. The selection signals are mutually complementary. Second resistors each have one terminal being connected to the second supply potential terminal and another terminal. Collectors of the second and third transistors of each respective one of the groups are connected to one another and to the other terminal of a respective one of the second resistors. The other terminal of the second resistor of each respective one of the groups is connected to the base of the first transistor of the respective group.

5 Claims, 4 Drawing Sheets

COMMON MODE LOGIC MULTIPLEXER CONFIGURATION

BACKGROUND OF THE INVENTION

Field of the Invention

The invention relates to a multiplexer configuration having the following characteristics:

a) at least one first and one second group of transistors each including one first, one second and at least one third transistor;

b) emitters of the transistors of the same group being connected to one another and each being connected through a respective current source to a terminal for a first supply potential;

c) collectors of the first transistors of each group being connected to one another and being connected through a first resistor to a terminal for a second supply potential;

d) a collector-side terminal of the first resistor being connected to an output terminal;

e) base terminals of the second transistors of each group each being an input terminal for one data signal;

f) base terminals of the third transistors of each group each being a terminal for one respective selection signal; and g) the selection signals being signals complementary to one another.

Such multiplexer configurations are known from German Patent DE 40 30 631 C2. Each current switch includes a reference transistor having a base at which a fixed reference potential is present. If a proper signal-to-noise level is to be adhered to, the signal level rise must not drop below a minimum rise (400 mV). That also limits the maximum operating speed, since the parasitic collector-to-substrate capacitances must undergo a charge reversal over the entire signal level rise.

SUMMARY OF THE INVENTION

It is accordingly an object of the invention to provide a common or current mode logic multiplexer configuration, which overcomes the hereinafore-mentioned disadvantages of the heretofore-known devices of this general type, in such a way that a higher operating speed is possible, with no loss of immunity to interference.

With the foregoing and other objects in view there is provided, in accordance with the invention, a multiplexer configuration, comprising at least one first group and at least one second group of transistors each including one first, one second and at least one third transistor each having an emitter, a collector and a base; a terminal for a first supply potential, current sources connected to the terminal for the first supply potential, the emitters of the transistors of each respective one of the groups being connected to one another and being connected to a respective one of the current sources; a terminal for a second supply potential, a first resistor having one terminal connected to the terminal for the second supply potential and having another terminal, the collectors of the first transistors of each respective one of the groups being connected to one another and being connected to the other terminal of the first resistor; an output terminal being connected to the other terminal of the first resistor; the bases of the second transistors of each respective one of the groups being an input terminal for a respective data signal; the bases of the third transistors of each respective one of the groups being a terminal for a respective selection signal; the selection signals being complementary to one another; second resistors each having one terminal being connected to the terminal for the second supply potential and each having another terminal, the collectors of the second and third transistors of each respective one of the groups being connected to one another and being connected to the other terminal of a respective one of the second resistors; and the other terminal of the second resistor of each respective one of the groups being connected to the base of the first transistor of the respective group.

In accordance with another feature of the invention, there are provided other current sources each being connected between the base of the first transistor of each respective one of the groups and the terminal for the first supply potential, the resistance of each of the second resistors being less than the resistance of the first resistor.

In accordance with a further feature of the invention, the current sources each have an emitter-side terminal connected to the emitters of the transistors of a respective one of the groups, and there are provided further resistors each being connected between the emitter of the first transistor of a respective one of the groups and the emitter-side terminal of a respective one of the current sources, and other resistors each being connected between the emitters of the second and third transistors of a respective one of the groups and the emitter-side terminal of a respective one of the current sources.

In accordance with an added feature of the invention, the groups of transistors are at least N groups of transistors, wherein $N=2^M$ and M is an integer greater than 1; each of the groups includes $M-1$ further transistors having collector-to-emitter paths being connected parallel to collector-to-emitter paths of the third transistors; and the bases of the $M-1$ further transistors and of the third transistor of each of the groups are each controlled by a different combination of M signals among M selection signals and signals complementary thereto.

In accordance with a concomitant feature of the invention, the selection signals are corresponding pairs of equal signals and the data signals are corresponding pairs of complementary signals, in a differential structure.

Other features which are considered as characteristic for the invention are set forth in the appended claims.

Although the invention is illustrated and described herein as embodied in a common or current mode logic multiplexer configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
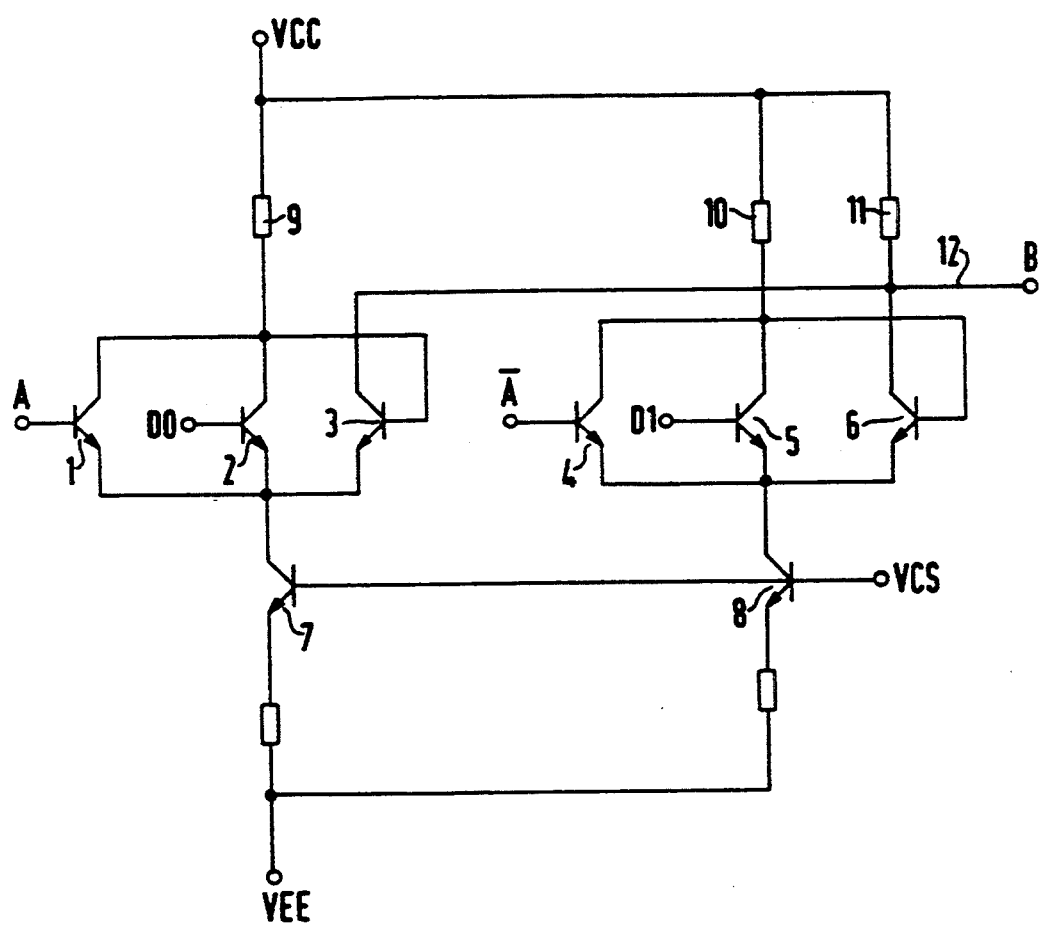
FIG. 1 is a schematic circuit diagram of a multiplexer configuration according to the invention.

Referring now in detail to the figures of the drawing, in which identical circuit elements in the various figures are identified by the same reference numerals, and first, particularly, to FIG. 1 thereof, there is seen a 2:1 multiplexer in which one of several input data signals D0, D1 is selected as a function of a selection signal A and is then present at an output of the multiplexer. Specifically, the multiplexer has the following elements: a first current switch containing first, second and third emitter-coupled transistors 3, 2, 1, which are connected through a current source 7 to a terminal for a first negative supply potential VEE. The current source is in the form of a bipolar transistor that is controlled by a fixed potential VCS and has an emitter-side resistor. A second current switch includes first, second and third emitter-coupled transistors 6, 5, 4, having emitters which are connected through a current source 8 to the first terminal for the supply potential VEE. The collector-to-emitter paths of the transistors 1, 2 and 4, 5 of the first and second current switches are respectively connected in parallel. The collectors of the transistors 1, 2 and 4, 5 are each connected through a respective second resistor 9, 10 to a terminal for a second positive supply potential VCC. The base of the transistor 1 is controlled by the selection signal A, and the base of the transistor 4 is controlled by a complementary selection signal $\overline{A}$. The data input signals D0 and D1 are applied to the base terminals of the respective transistors 2 and 5. The collectors of the transistors 3, 6, are connected to one another and, through a first resistor 11, to the terminal for the supply potential VCC. The collectors of the transistors 3, 6 are also connected to an output terminal 12 that carries an output signal B. The base terminals of the transistors 3, 6 are each connected to the collector-side terminal of a respective one of the resistors 9 and 10.

The circuit functions as follows: If the selection signal A is at an L level, the transistor 1 is blocked. If the signal D0 is H, then the transistor 2 is conducting, so that the current of the current source 7 flows through the transistor 2. The collector-side terminal of the resistor 9 is at L potential, so that the transistor 3 is blocked. This sets the output signal B at the output 12 to H. If the input signal D0 is L, then the transistor 2 is blocked, so that the collector-side terminal of the resistor 9 is at H. This makes the transistor 3 conducting, so that the current of the current source 7 flows through a resistor 11 and the transistor 3. As a result, the signal B at the output 12 adjusts to L. Accordingly, when the signal A of the 2:1 multiplexer is at L, the input signal D0 is selected and appears as the output signal B at the output 12.

If the selection signal A is at H, then the current of the current source 7 flows through the transistor 1 regardless of the state of the signal D0 or the switching state of the transistor 2. The signal level of the signal D0 then has no influence on the output signal B. The signal $\overline{A}$ at the base of the transistor 4 is then L, so that the output signal B is established in accordance with the input signal D1.

Since the base of the transistor 3 is connected to the collectors of the transistors 1, 2, the result for the current switch which includes the transistors 1, 2, 3 and the current source 7 and is constructed as a differential amplifier, is a positive feedback. Through the use of the positive feedback, the gain of the differential amplifier is increased. This means that the transfer curve of the differential amplifier, in other words the characteristic curve of the signal at the collector of the transistor 3, viewed as a function of one of the signals A and D0, has a steeper course. The same is correspondingly true for the second current switch including the transistors 4, 5, 6 and the current source 8. As compared with the known multiplexer, the multiplexer of the invention accordingly has the advantage of a greater signal-to-noise ratio at the same signal level. On the other hand, this means that as compared with the known multiplexer, the signal level can be lowered while having the same immunity to interference. Since there is a lesser signal level rise, the charge reversal currents necessary to reverse the charge of the parasitic collector-to-substrate capacitances of the switching transistors are lower during a charge reversal process. The overall result is that the operating speed is increased as compared with the known multiplexer. Moreover, a lesser current to be furnished by the current sources 7, 8 is sufficient to attain a lesser signal level rise, at a comparable resistance of the operating resistor 11. The power loss is accordingly reduced.

Figure 2:
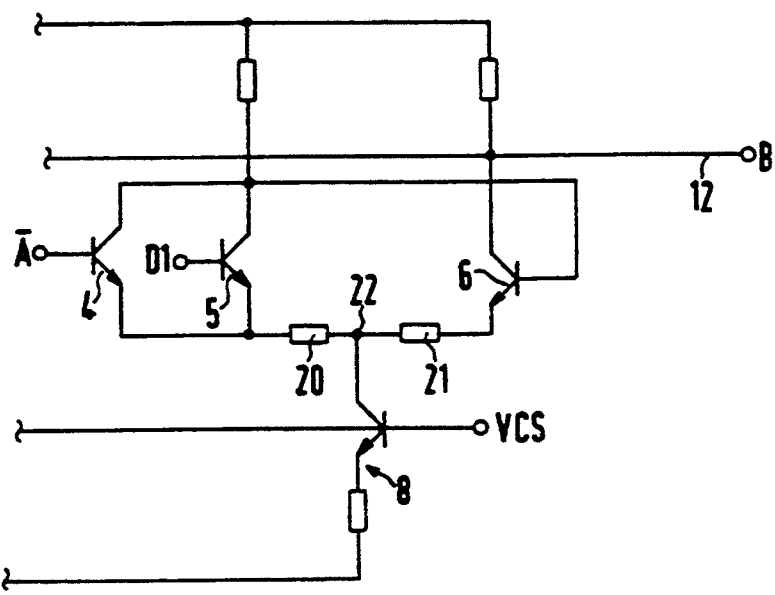
FIG. 2 is a schematic diagram of a compensation circuit for the multiplexer configuration.
Figure 3:
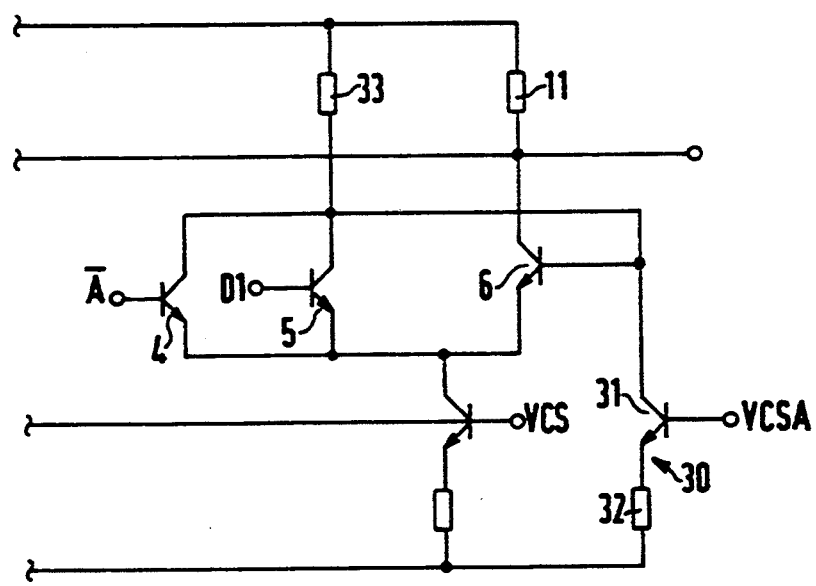
FIG. 3 is a schematic diagram of a further compensation circuit for the multiplexer configuration.

The multiplexer of FIG. 1 has the characteristic of having hysteresis occur if the current switch is operated at saturation, or in other words the signal levels of the input and output signals are in the saturated range of the transfer curve. The maximum possible signal level rise for operation without hysteresis is approximately four times the temperature voltage (approximately 100 mV). In the case of a signal level rise exceeding that, compensation circuits become necessary so that operation without hysteresis will continue to be possible. FIGS. 2, 3 show two possible types of circuits for compensating for the switching hysteresis occurring at increased signal level rises. For the sake of simplicity, only one of the two current switches, each forming one 2:1 multiplexer, is shown.

A first embodiment of the compensation circuit is shown in FIG. 2. To that end, another resistor 20 is connected between a terminal 22 of the current source 8 and the coupled emitters of the transistors 4, 5, and a further resistor 21 is connected between the terminal 22 and the emitter of the transistor 6. In a correspondingly non-illustrated manner, one resistor is disposed between the emitters of the transistors 1, 2 and the corresponding terminal of the current source 7 and another resistor is disposed between the emitter of the transistor 3 and the terminal of the current source 7. Negative feedback is brought about by the resistors 20, 21 in the differential amplifier of the transistors 4, 5, 6 and the current source 8. The emitter potentials of the emitter-coupled transistors 4, 5 and 6 are then shifted away from one another by the voltage drop at the resistors 20, 21, so that the possible range of values of the signal level stroke for which the current switch operates without hysteresis is increased.

In the compensation circuit of FIG. 3, a compensation current is fed in at the base of the transistor 6 by means of another current source 30, which is disposed between the base of the transistor 6 and the terminal for the supply potential VCC. The current source 30 includes a transistor 31 with an emitter-side resistor 32. The base of the transistor 31 is connected to a further fixed potential VCSA. The potential VCSA may be equal to the potential VCS and may also be furnished by the same potential source. A resistor 33 and the resistor 11 disposed in the respective collector branches of the transistors 4, 5, and 6 then have different resistances, in contrast to the exemplary embodiments described above. The resistor 33 has a lower resistance than the resistor 11. As a result of the current from the compensating current source 30 additionally flowing through the resistor 33, in conjunction with different resistances of the resistors 33 and 11, the level value for the L level at the base of the transistor 6 is higher than the value of the L level of the input and output signals, and the value of the H level at the base of the transistor 6 is lower than the value of the H level of the input and output signals. Thus the signal level rise of the input and output signal levels permits a changeover of the current switches without hysteresis within a larger range of values. It is important in this respect that the ratio between the resistances of the resistors 33, 11 and the current impressed by the compensating current source 30 are dimensioned as a function of one another in such a way that the L and H level of the signal present at the base of the transistor 6 and the L and H level of the input and output signals are each located symmetrically about the same mean value. The mean value is equal to the switching threshold of the current switch.

Figure 4:
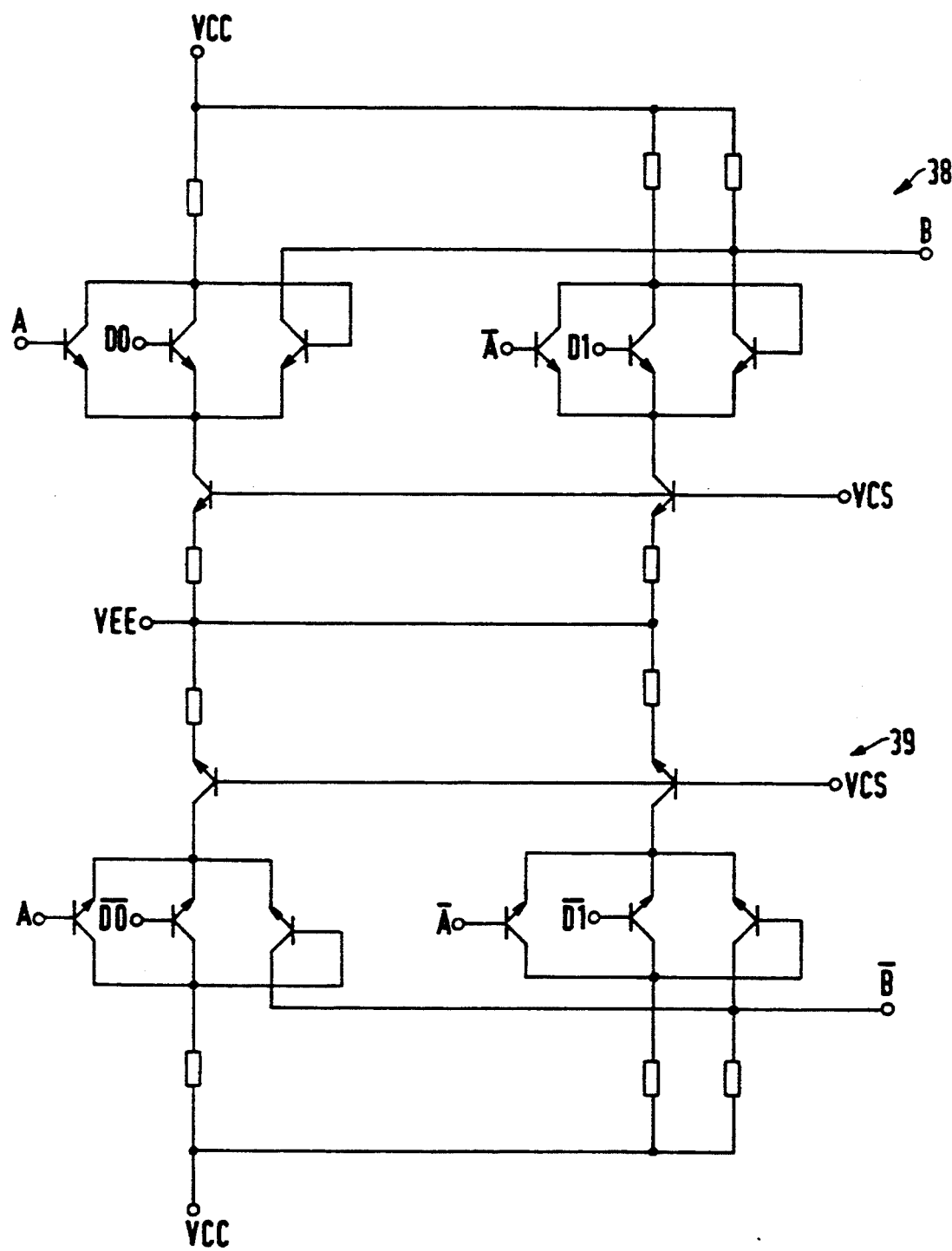
FIG. 4 is a schematic circuit diagram of the multiplexer configuration in a differential version.

A differential version of a multiplexer according to the invention is shown in FIG. 4. It includes two multiplexers 38, 39 having the structure shown in FIG. 1. Input terminals which correspond to one another, for the selection signals of the two multiplexers 38, 39, are controlled in-phase by the signals A, $\overline{A}$. Inputs which correspond to one another for the data signals of the multiplexers 38, 39 are controlled by complementary data signals. This means that the data signals D0, D1 are delivered to the multiplexer 38 and complementary data signals $\overline{D0}, \overline{D1}$ are fed to the multiplexer 39 at the corresponding inputs. The compensation circuits shown in FIGS. 2 and 3 are correspondingly applicable to the current switches included in the multiplexers 38, 39 as well.

Figure 5:
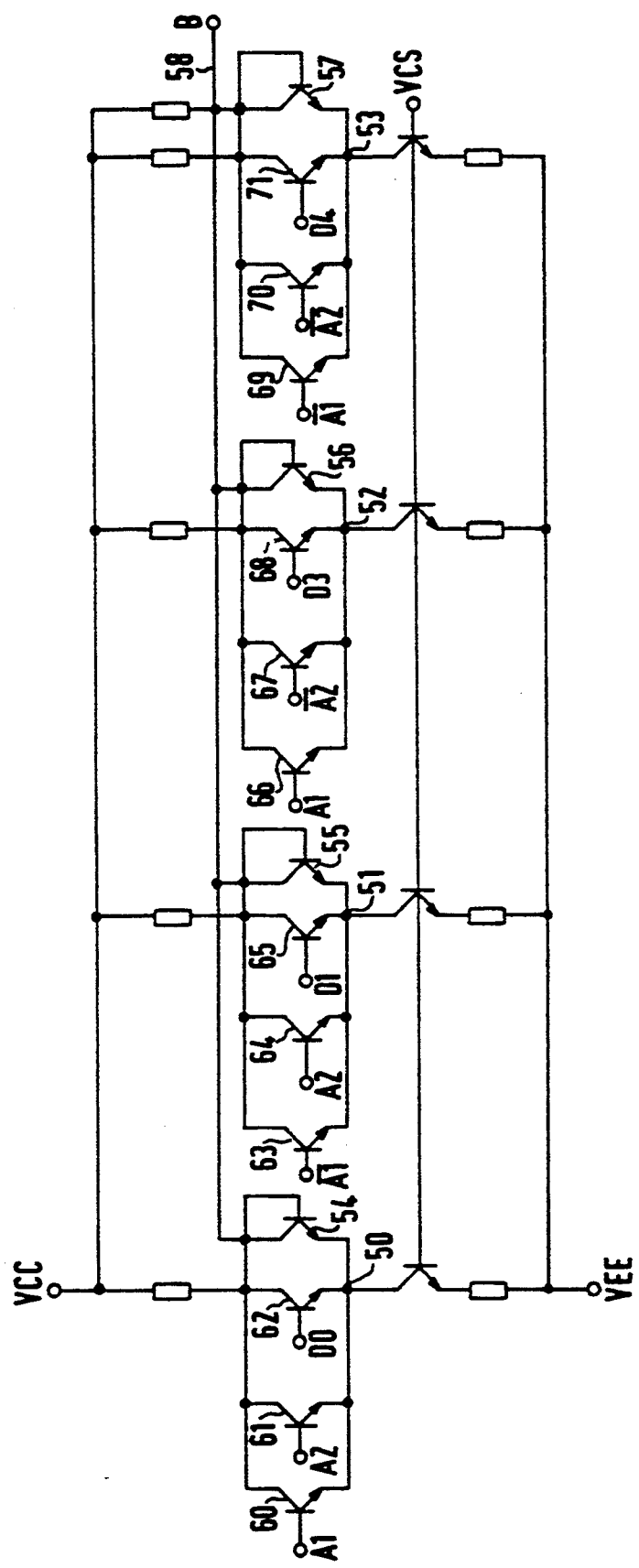
FIG. 5 is a schematic circuit diagram of a further embodiment of the multiplexer configuration.

The embodiments shown in the drawings each pertain to 2:1 multiplexers. With the structure according to the invention, N:1 multiplexers for N data input signals and one output signal are also possible. N is the Mth power of 2 ($2^M$), and M is an integer greater than or equal to 2. In FIG. 5, a 4:1 multiplexer is shown as an example. The N:1 multiplexer includes N current switches 50, 51, 52, 53, each having a switching transistor 54, 55, 56, 57 with a collector which is fed back to its base and is connected in common to an output signal terminal 58. Each current switch includes M+1 further transistors 60, 61, 62, 63, 64, 65, 66, 67, 68, 69, 70, 71 being connected in parallel at their collector-to-emitter paths. One of the transistors of each current switch is controlled by a respective data input signal D0, D1, D3, D4, while the other M transistors are controlled by selection signals. In all, a number of M different selection signals A1, A2, and M signals $\overline{A1}, \overline{A2}$ complementary thereto, are present. The selection transistors of each current switch are controlled by a combination of M signals, and this combination is selected from the 2×M selection signals and signals complementary thereto. Each combination is such that at arbitrary selection signal values, all M selection transistors are blocked only for a single current switch at a time. The applicable data input signal is then selected and is located at the output 58. This is achieved because each combination of selection signals and the signals complementary thereto occurs only a single time. That is, the first combination for the current switch 50 includes the signals A1, A2; the second combination for the current switch 51 includes the signals $\overline{A1}$, A2; the third combination for the current switch 52 includes the signals A1, $\overline{A2}$, and so forth.

In an N:1 multiplexer as well, a differential version or the use of compensating circuits is possible. An advantage of an N:1 multiplexer is that the signal delay times of all of the inputs for the data and selection signals are equal to the output.

A clock-state-controlled memory element can be obtained from a 2:1 multiplexer in accordance with FIG. 1, by coupling the output back to one of the data signal inputs.

I claim:
1. A multiplexer configuration, comprising:
   a) at least one first group and at least one second group of transistors each including one first, one second and at least one third transistor each having an emitter, a collector and a base;
   b) a terminal for a first supply potential, current sources connected to said terminal for the first supply potential, the emitters of said transistors of each respective one of said groups being connected to one another and being connected to a respective one of said current sources;
   c) a terminal for a second supply potential, a first resistor having one terminal connected to said terminal for the second supply potential and having another terminal, the collectors of said first transistors of each respective one of said groups being connected to one another and being connected to the other terminal of said first resistor;
   d) an output terminal being connected to the other terminal of said first resistor;
   e) the bases of said second transistors of each respective one of said groups being an input terminal for a respective data signal;
   f) the bases of said third transistors of each respective one of said groups being a terminal for a respective selection signal;
   g) the selection signals being complementary to one another;
   h) second resistors each having one terminal being connected to said terminal for the second supply potential and each having another terminal, the collectors of said second and third transistors of each respective one of said groups being connected to one another and being connected to the other terminal of a respective one of said second resistors; and
   i) the other terminal of said second resistor of each respective one of said groups being connected to the base of said first transistor of said respective group.

2. The multiplexer configuration according to claim 1, including other current sources each being connected between the base of said first transistor of each respective one of said groups and said terminal for the first supply potential, the resistance of each of said second resistors being less than the resistance of said first resistor.

3. The multiplexer configuration according to claim 1, wherein said current sources each have an emitter-side terminal connected to the emitters of said transistors of a respective one of said groups, and including further resistors each being connected between the emitter of said first transistor of a respective one of said groups and the emitter-side terminal of a respective one of said current sources, and other resistors each being connected between the emitters of said second and third transistors of a respective one of said groups and the emitter-side terminal of a respective one of said current sources.

4. The multiplexer configuration according to claim 1, wherein said groups of transistors are at least N groups of transistors, wherein $N=2^M$ and M is an integer greater than 1; each of said groups includes $M-1$ further transistors having collector-to-emitter paths being connected parallel to collector-to-emitter paths of said third transistors; and the bases of said $M-1$ further transistors and of said third transistor of each of said groups are each controlled by a different combination of M signals among M selection signals and signals complementary thereto.

5. The multiplexer configuration according to claim 1, further comprising at least two additional groups of transistors, said additional groups of transistors each receiving a different set of true and complementary selection and data signals respectively than said at least first and second groups of transistors, in a differential structure.

* * * * *